(12) United States Patent
Abbadie et al.

(10) Patent No.: US 7,250,085 B2
(45) Date of Patent: Jul. 31, 2007

(54) METHOD OF WET CLEANING A SURFACE, ESPECIALLY OF A MATERIAL OF THE SILICON-GERMANIUM TYPE

(75) Inventors: Alexandra Abbadie, Ueylan (FR); Pascal Besson, Notre Dame de Mésage (FR); Marie-Noëlle Semeria, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 11/026,186

(22) Filed: Dec. 29, 2004

(65) Prior Publication Data

US 2005/0139231 A1    Jun. 30, 2005

(30) Foreign Application Priority Data

Dec. 31, 2003  (FR) .................................. 03 51239

(51) Int. Cl.
*C23G 1/00* (2006.01)

(52) U.S. Cl. .................. 134/2; 134/3; 134/26; 134/27; 134/28; 134/34; 134/35; 134/36; 134/32; 134/33; 134/41; 134/42; 134/902; 510/175

(58) Field of Classification Search .................... 134/2, 134/3, 26, 27, 28, 34, 35, 36, 32, 33, 41, 134/42, 902; 510/175
See application file for complete search history.

(56) References Cited

U.S. PATENT DOCUMENTS

| | | | |
|---|---|---|---|
| 5,470,393 A | | 11/1995 | Fukazawa |
| 5,810,940 A | * | 9/1998 | Fukazawa et al. .............. 134/3 |
| 6,368,415 B1 | * | 4/2002 | Asaoka .......................... 134/3 |
| 6,521,534 B1 | * | 2/2003 | Robinson et al. ........... 438/691 |

(Continued)

FOREIGN PATENT DOCUMENTS

| | | |
|---|---|---|
| EP | 0 952 609 | 11/1999 |
| EP | 1 005 072 | 5/2000 |

OTHER PUBLICATIONS

Tardif et al. Diluted Dynamic Clean : "DDC" *Proceedings of the 3rd International Symposium on Ultra clean Processing of Silicon Surfaces, Antwerp. Belgium* pp. 175-178 (1996).

(Continued)

*Primary Examiner*—Sharidan Carrillo
(74) *Attorney, Agent, or Firm*—McKenna Long & Aldridge LLP

(57) ABSTRACT

Method of wet cleaning a surface of at least one material chosen from silicon, silicon-germanium alloys, A(III)/B(V)-type semiconductors and epitaxially grown crystalline materials, such as germanium, in which method the following successive steps are carried out:

a) the surface is brought into contact with an HF solution;
b) the surface is rinsed with acidified, deionized water, then a powerful oxidizing agent is added to the deionized water and the rinsing is continued;
c) optionally, step a) is repeated, once or twice, while optionally reducing the contacting time;
d) step b) is optionally repeated, once or twice; and
e) the surface is dried.

Process for fabricating an electronic, optical or optoelectronic device, such as a CMOS or MOSFET device, comprising at least one wet cleaning step using the said cleaning method.

3 Claims, 4 Drawing Sheets

U.S. PATENT DOCUMENTS

2001/0003680 A1* 6/2001 Brunner et al. ............. 438/745
2002/0189640 A1* 12/2002 Linn et al. ..................... 134/3
2003/0019507 A1* 1/2003 Kashkoush et al. ........... 134/3
2004/0127032 A1* 7/2004 Peng et al. ................. 438/689

OTHER PUBLICATIONS

Tardif, et al. "New Aspects of the Diluted Dynamic Clean Process" *Solid State Phenomena* vol. 65-66:19-22 (1999).

Hartmann et al. "Gas-source molecular beam epitaxy of SiGe virtual substrates: II. Strain relaxation and surface morphology" *Semicond. Sci. Technol.* 15:370-377 (2000).

Sawano et al. "Surface smoothing of SiGe strain-relaxed buffer layers by chemical mechanical polishing" *Materials Science and Engineering* B89:406-409 (2002).

Sawano et al. "Surface Planarization of Strain-Relaxed SiGe Buffer Layers by CMP and Post Cleaning" *Journal of The Electrochemical Society* 150(7):G376-G379 (2003).

* cited by examiner

METHOD OF WET CLEANING A SURFACE, ESPECIALLY OF A MATERIAL OF THE SILICON-GERMANIUM TYPE

This application claims priority under the provisions of 35 U.S.C. §119 to French Application No. 03 51239, filed on Dec. 31, 2003 which is incorporated herein by reference in its entirety.

BACKGROUND OF THE INVENTION

The present invention relates to a method of wet cleaning a surface, in particular a surface of a material of the silicon-germanium type, and especially of an $Si_{1-x}Ge_x$ material where x is greater than 0 and less than 1, x preferably lying in the range from 0.1 to 0.9, more preferably from 0.1 to 0.7.

The technical field of the invention can in general be defined as that of the cleaning and decontamination of surfaces, in particular of surfaces of materials used in microelectronics, optics or electronics, especially surfaces of materials of the silicon-germanium alloy type, such as polished and crystalline $Si_{1-x}Ge_x$. The contaminants that may be on these surfaces may be of any type, namely particulate contaminants, organic contaminants, mineral contaminants, metallic contaminants, etc.

Specifically, the constant development in microelectronic integrated circuits based on CMOS silicon has been achieved thanks to the improvement in their performance and to the miniaturization of their elementary components. However, owing to the ever increasing density of interconnections, silicon would seem, in the near future, to be a major physical limitation. The SIA (Semiconductor Industry Association) roadmap has therefore anticipated the use of new materials. One of the materials exhibiting the greatest potential, with many integration options, for architectures of higher performance is germanium in the form of silicon-germanium alloys.

The material SiGe is deposited by epitaxy on silicon substrates. Thin silicon layers, called "silicon-under-tension" layers, may be deposited on these substrates. This silicon-under-tension on SiGe appears to be highly advantageous owing to the electronic properties that it confers on the elementary components, such as MOSFET (metal-oxide semiconductor field-effect transistor) or CMOS-type integrated circuit components.

The strained silicon may be a buried layer or a surface layer, and it greatly increases the electron mobility. Various processes have been described for forming this strained silicon on SiGe, using in particular the SOI (Silicon On Insulator) process.

Thus, several processes for fabricating these SiGe relaxed substrates have been described, such as for example in document [1]. One of their main characteristics is the presence of surface cross-hatching. Such cross-hatching stems from the presence of dislocations that form and propagate in a thick graded layer (with a thickness of several microns) at the base of these substrates. They are necessary in order for them to be almost completely relaxed, the purpose being to maintain the lowest possible defect density on the surface. As a result, this structure has, after epitaxy, a high surface roughness (several nm), which increases with the percentage of Ge in the alloy. Chemical-mechanical polishing (CMP) as described in document [2] is then necessary, before transfer of an SiGe layer or re-epitaxy of strained silicon, in order to eliminate this roughness and practically all the surface cross-hatching, so as to obtain a final surface roughness of less than 1 nm.

An optimized wet cleaning method is therefore of paramount importance after the CMP (chemical-mechanical polishing). It must be effective, so as to remove the contamination introduced by the polishing, composed especially of microparticles and nanoparticles, organic contamination and metallic contamination, without thereby degrading the initial surface morphology. This point is particularly important as regards relaxed SiGe substrates, which exhibit different chemical properties towards certain cleaning solutions commonly employed in microelectronics.

Thus, an SC1 (Standard Cleaning 1) solution, which constitutes part of the RCA (Radio Corporation of America) cleaning procedure, the most widely used at the present time on silicon and other materials, causes virulent etching of the SiGe surfaces. Even over short times and at low temperature, this treatment may create a surface microroughness, or even a major resurgence of surface cross-hatching, not compatible with the envisaged electronic applications. This sensitivity to SC1 but also SC2 (Standard Cleaning 2) solutions for germanium contents of greater than 50% depends on the percentage of germanium concentration of the alloy and on the temperature of the solution. The pronounced roughening effect of this type of solution on the surface of $Si_{1-x}Ge_x$ substrates (where x=0.3 to 0.7) has been recently reported in document [3]. The use of such chemistries is here and now unacceptable for technological integration of SiGe materials with a high Ge content ($\geq 30\%$).

A wet cleaning method aimed at overcoming the drawbacks of the conventional RCA cleaning procedure has been described in the literature in the case of silicon substrates. This is what is called the DDC (Diluted Dynamic Clean) method that relies fundamentally on the use of solutions of dilute chemicals, at room temperature, and combines two chemical baths prepared in quartz tanks, one of these baths, dedicated to the injection of chemicals, being recirculated and filtered.

This method is described in particular in documents [4] and [5] relating the pre-gate cleaning (i.e. gate oxide prediffusion cleaning) and is illustrated in FIG. 1. It employs a bath (1) in a rinsing tank (2), with an overflow (3), in which small quantities of reactants, such as hydrochloric acid or gaseous ozone, are injected together or alternately (at 4) into a stream of deionized water (5) that feeds the tank (6).

In FIG. 1, it should be noted that the reactants, such as HCl or $O_3$, are injected (at 7) into the deionized water feed line (5) of the overflow tank (2), downstream of a static mixer (8) which is used to make the mixture of the deionized water and the reactants homogeneous thanks to the recirculation of the fluids as accomplished by the said static mixer (8).

The excess chemical bath of the tank is generally received by the overflow (3) and is discharged (9). Such a tank makes it possible for the cleaning method and the associated rinsing to be carried out alternately in the same bath. As a result, the space normally occupied by the rinsing bath may be eliminated. If the quantity of chemicals is negligible in the case of cleaning using dilute solutions, the overflow may be discharged directly in such a way that the substrates, for example the cleaned wafers, are always in contact with fresh reactants.

Another tank (10) contains a bath (11) consisting of a dilute solution, generally a 1% solution, of hydrofluoric acid in deionized water. This other tank comprises, so as to limit fluorinated discharges, a recirculation loop generally provided with a pump (12), a filter (13), an oxygen desorption device (14) in order to continuously eliminate the dissolved gases and a chemical purifier (15) in order to eliminate the noble metals. The oxygen collected is discharged via the line (16).

A wet cleaning sequence tailored to gate oxide prediffusion cleaning with silicon substrates therefore comprises the following successive steps:

treatment with deionized water containing 3 ppm $O_3$ [4] or 20 ppm $O_3$ [5], for 5 minutes in order to eliminate the noble metals and the organic compounds;

treatment with a 1% HF solution, acidified by 1% of HCl, for more than 0.5 minutes (overetch treatment) in order to eliminate the sacrificial oxide and the metals;

rinsing for 5 minutes with deionized water (without any other additive);

treatment with deionized water containing 3 ppm $O_3$ for 10 minutes and then with the above-described HF/HCl solution for 1 minute, so as to eliminate the particles;

rinsing for 5 minutes with deionized water acidified by HCl; and treatment with ozonized water containing 3 ppm $O_3$ and acidified with 0.01% HCl, in order to carry out a final passivation.

The drawbacks of the method of documents [4] and [5] applied to Si substrates are especially the following:

The etching of the silicon is very difficult to control, since silicon is very sensitive to etching by HF/HCl; the deoxidation time must be very accurately adjusted so as to prevent any roughening of the silicon; excessive consumption of silicon results in problems in the subsequent device fabrication process steps, such as alignment and layer deposition problems, and epilayer growth quality problems.

Moreover, the method of documents [4] and [5] is specifically designed for and tailored to gate oxide prediffusion cleaning on silicon substrates and surfaces, and the steps of this method, the succession of these steps, their duration and the specific reactants that are employed during each of the steps have been specifically optimized to eliminate contamination, whether this be of organic, metallic, particulate or other origin, of such substrates, specifically silicon substrates, and the effectiveness of this method has been demonstrated only in the case of silicon surfaces.

There therefore exists a need for a method of wet cleaning surfaces which is of higher performance and greater effectiveness for cleaning silicon substrates, and in particular there exists a need for a method of cleaning surfaces made of silicon-germanium alloy, for example $Si_{1-x}Ge_x$ surfaces (where x is greater than 0 and less than 1, for example x ranging from 0.1 to 0.9) which, while ensuring very effective cleaning and allowing elimination of all contaminations, whether organic, metallic, particulate or of other type, is at least equivalent to that of the conventional RCA cleaning procedure, but does not have the drawbacks of the latter.

In other words, there exists a need for a method of wet cleaning surfaces, particularly surfaces made of silicon-germanium alloys, which is not only very effective and completely eliminates all the contaminants, but does not cause roughening of the substrate and the resurgence of surface cross-hatching.

This method must also be reliable, easy to implement, comprise a limited number of steps, be of relatively short duration, use small quantities of easily available reactants and reduce the amounts discharged into the environment.

SUMMARY OF THE INVENTION

The object of the invention is to provide a method of wet cleaning surfaces, in particular surfaces made of silicon-germanium alloys, which, among other things, meets the needs and satisfies the requirements mentioned above.

The object of the invention is also to provide such a wet cleaning process that does not have the drawbacks, limitations, defects and disadvantages of the cleaning methods of the prior art and solves the problems of the prior art.

This object and yet others are achieved, in accordance with the invention, by a method of wet cleaning a surface made of at least one material chosen from silicon, silicon-germanium alloys, A(III)/B(V)-type semiconductors and epitaxially grown crystalline materials, such as germanium, in which method the following successive steps are carried out:

a) the surface is brought into contact with an HF solution with an HF concentration of 0.2 to 2% by volume, preferably 1% by volume, in deionized water (DIW), for a time of 10 minutes of less, preferably 1 to 5 minutes, for example 4 minutes, the pH of the said solution being maintained at a value of from 1 to 2, preferably close to 1, throughout the duration of the contacting;

b) the surface is rinsed with acidified, deionized water for a time of 1 to 5 minutes, preferably 1 to 3 minutes, for example 3 minutes, then a powerful oxidizing agent is added to the deionized water and the rinsing is continued for a time of 5 to 10 minutes, preferably 5 to 7 minutes, for example 7 minutes; the pH being maintained at a value of 5 or less 5, preferably 3 to 5, throughout step b);

c) optionally, step a) is repeated, once or twice, while optionally reducing the contacting time, which is then preferably between 30 seconds and 2 minutes, for example 1 minute 30 seconds;

d) step b) is optionally repeated, once or twice; and e) the surface is dried.

Advantageously, in step a) and/or step c), the pH is maintained by adding HCl to the HF solution, generally with a concentration of 0.5 to 2% by volume, preferably 1% by volume, of the solution.

Advantageously, in step a) and/or step c), one or more complexing or oxidizing agents, such as HCl, are added to the solution, preferably with a concentration of 0.5 to 2% by volume of the solution so as to maintain the pH of the rinsing solution.

Advantageously, step a) and/or step c) is (are) carried out in a tank provided with a recirculation loop preferably provided with a purifying filter and/or with a degasser and/or with a chemical purifier, which eliminates the metallic and particulate contamination, in particular by noble metals. More preferably, the above three items of equipment are present as such a configuration with three items of equipment allows the best performance to be achieved.

Advantageously, in step b) and/or d), the pH is maintained by adding HCl to the deionized water so as generally to obtain a concentration of 0.01 to 1% by volume.

Advantageously, in step b) and/or d), the oxidizing agent is gaseous ozone, added to the deionized water so as to obtain a concentration generally of 3 to 15 ppm, preferably 6 ppm.

Advantageously, in step b) and/or d), the rinsing carried out is megasonic rinsing, the megasonic waves preferably being applied for a time of 5 minutes or longer, more preferably 10 minutes or longer, for example 10 to 20 minutes.

Advantageously, the drying of step c) is carried out by bringing the surface into contact with isopropanol (Isopropyl Alcohol or IPA) or by centrifugation.

Advantageously, the entire method is carried out at room temperature, namely, in general, from 20 to 30° C., preferably 22 to 25° C., for example 23° C.

Advantageously, and prior to step a), a precleaning step $a_0$) is carried out by bringing the surface into contact with an aqueous solution containing ozone generally with a concentration of 6 ppm or more, preferably 6 to 20 ppm, for example 20 ppm, or with an $H_2SO_4$ solution to which $H_2O_2$ has been added, namely in general 0.5 vol % or less of $H_2O_2$ has been added, i.e. generally in proportions of 100 cm$^3$ of $H_2O_2$ in undiluted $H_2SO_4$. In the latter case, the duration of contacting is advantageously from 5 to 10 minutes, for example 5 minutes.

Preferably, the surface is a crystalline and/or polished surface.

The method according to the invention has a specific series of specific steps, each defined by specific operating conditions such as the pH, the temperature, the duration and essentially the nature and concentration of the reactant(s) employed.

Such a method has never been disclosed or suggested in the prior art.

The method of the invention is distinguished from the methods of the prior art which make use of dilute reactants, such as those described especially in documents [4] and [5], in particular by the fact that, in step b), the pH is maintained at a value of less than 5, for example by the addition of HCl. This means that, compared with the methods of the prior art, an additional acid rinsing operation is carried out. This modification of the methods of the prior art, such as those of documents [4] and [5], fundamentally improves the efficiency of the cleaning of these methods on silicon substrates, but also, surprisingly, on other substrates.

In other words, the method according to the invention makes it possible, whatever the type of cleaned surface—Si or other surface, and in general, for a non-roughening and very effective cleaning operation to be carried out, with a low consumption of reactants.

The improvements of the method according to the invention over the methods of the prior art, such as those of documents [4] and [5] are obtained for Si substrates but also for other substrates, such as in particular SiGe substrates.

For example, the removal of particulate and metallic contamination is improved on Si substrates and is achieved in an extremely easy manner, surprisingly, also on SiGe substrates. The same applies as regards low surface roughness and low HF concentration, which are improved when treating Si substrates but which are also achieved, surprisingly and in an excellent manner, on SiGe substrates.

The method according to the invention may thus more precisely be defined as a DDC (Diluted Dynamic Clean)-type method which can be applied to silicon-germanium alloy surfaces.

A similar method has already been described, as mentioned above [4] [5], but this was developed specifically for cleaning silicon surfaces and has proved its feasibility and its effectiveness only for cleaning such silicon surfaces for which it does have, however, certain limitations as regards the subsequent microelectronic device fabrication steps.

Because of the fundamental differences that exist between, on the one hand, silicon surfaces and, on the other hand, silicon-germanium alloy surfaces, a cleaning method for a silicon surface can in no case be transposed directly to a silicon-germanium surface.

Furthermore, it is absolutely impossible to deduce from the fact that a cleaning/rinsing solution and a method employing it give excellent results for cleaning a silicon surface that this same solution will also give excellent results for cleaning an SiGe surface.

This is because the behaviour of a solution with respect to one surface (and vice versa) is completely unpredictable and its behaviour with respect to a surface made of another material cannot be deduced therefrom.

Astonishingly, it has been shown that the DDC-type method according to the invention, although giving excellent results on silicon substrates, could also, surprisingly, be suitable for SiGe substrates and other substrates.

The method according to the invention overcomes the drawbacks of the methods of the prior art, meets the requirements mentioned above and solves the problems of the methods of the prior art.

In fact, the method according to the invention, which may also be defined for example as "ozone-based aqueous cleaning", is an effective and non-roughening method carried out at room temperature and involving an HF/ozone chemistry that has the same functions of removing contamination, whether organic, metallic, particulate or other contamination, as the conventional SC1 and SC2 type chemistries constituting the RCA cleaning procedure, but which, compared with this procedure, has many advantages such as a lower consumption of chemicals, a shorter cycle time, etc.

The method according to the invention makes it possible to carry out an effective surface treatment that is non-roughening and is particularly suitable for SiGe alloy surfaces, especially preferably for crystalline and/or polished $Si_{1-x}Ge_x$ surfaces, where x is greater than 0 and less than 1, x preferably lying within the range from 0.1 to 0.9, more preferably from 0.1 to 0.7 and even better still from 0.2 to 0.5.

The method according to the invention is particularly applicable to $Si_{1-x}Ge_x$ surfaces with a high percentage of Ge, namely 20 to 70% germanium.

The method according to the invention has a high efficiency, possibly up to 70% to 90% in the case of all values of x, and it may be carried out without any particular modification whatever the germanium content of the alloy. In no case does the method according to the invention involve any degradation of the alloy layer.

A cleaning method more particularly suitable for SiGe surfaces satisfying, for example, the formula $Si_{1-x}Ge_x$, where x lies within the ranges indicated above, comprises the following successive steps:

$a_0$) the surface is brought into contact with an $H_2SO_4$ solution to which 0.5 vol % or less of $H_2O_2$ has been added (generally corresponding to approximately 100 cm$^3$ of $H_2O_2$), for a time of about 5 minutes;

a) the surface is brought into contact with an HF/HCl solution, having respective concentrations of 0.2 vol % and 1 vol %, in deionized water, for a time of about 4 minutes;

b) the surface is rinsed with a 0.01 vol % HCl solution in deionized water for a time of about 3 minutes;

c) the surface is rinsed with a 0.01 vol % HCl solution in deionized water, into which 6 ppm of $O_3$ (concentration) has been injected, in the presence of megasonic waves generally, preferably, for a time as mentioned above for such a step;

d) step a) is repeated, the contacting time being about 1 minute 30 seconds;

e) step b) is repeated;

f) step c) is repeated; and g) the surface is dried.

The advantages afforded by the method of the invention are inter alia the following:

the particulate removal efficiency (PRE) obtained after cleaning by the method of the invention is very high, close to 90%, and varies depending on the Ge content present in the alloys, the PRE being greater than 95% for $Si_{0.8}Ge_{0.2}$ and close to 85% for $Si_{0.5}Ge_{0.5}$. The residual defects that are not cleaned are ascribed to epitaxial defects;

the consumption of SiGe material brought about by cleaning using the method of the invention is less than and negligible compared with that obtained on silicon. This consumption is, for example, 20 Å for an SiGe containing 20 to 50% Ge. In contrast, in an RCA-type medium in dilute chemistry, the high SiGe/Si selectivity, which for example is greater than or equal to 4, is mainly dependent on the concentration of the solutions used, resulting in all cases in more pronounced etching of the alloy with increasing % of Ge;

the surface morphology obtained, as observed by AFM (Atomic Force Microscopy), is smooth with an $R_{rms}$ (root mean square roughness of various points on the surface) of generally <0.5 nm, is flat, that is to say without surface cross-hatching, and is identical to a polished surface, whatever the Ge content of the alloy. This morphology differs completely from that obtained by dilute RCA cleaning, especially as soon as the Ge content is above 30%;

in this regard, the reader may refer to FIG. 3, showing an $Si_{0.5}Ge_{0.5}$ surface after RCA cleaning with $R_{rms}=0.8$ nm and $R_{max}=8.05$ nm; and to FIG. 4, showing an $Si_{0.5}Ge_{0.5}$ surface after cleaning according to the invention, with $R_{rms}=0.44$ nm and $R_{max}=2.83$ nm. The visual comparison of these mircrographs and of the $R_{rms}$ and $R_{max}$ values clearly demonstrate the superiority of the method of the invention; and in addition, analysis of the metallic contamination reveals the absence of metallic contaminants after cleaning, or a negligible contamination, close to the detection limit using a mass spectrometry decomposition technique (VPD-ICPMS or Vapour Phase Decomposition Inductively-Coupled Plasma Mass Spectrometry), that is to say a contamination of less than $10^{10}$ at/cm$^2$.

It should be noted that this cleaning may be carried out not only on Si or SiGe surfaces, but also on SOI (Silicon On Insulator) substrates (the surface is therefore made of Si), SsGOI (Strained Silicon on SiGe on Insulator) substrates and on surfaces composed of A(III)/B(V)-type materials, such as InP, GaAs, etc., and of other epitaxially grown crystalline materials, for example germanium, by adapting the duration of the method and the HCl and HF concentrations.

Of course, the surface may be a composite surface comprising several of the abovementioned materials.

In conclusion, according to the invention the cleaning may be carried out under dilute (HF) chemistry conditions without impairing the efficiency of the removal of the particulate and metallic contamination.

The invention also relates to a process for fabricating electronic, optical or optoelectronic devices, comprising at least one step of wet cleaning a surface of a material chosen from silicon, silicon-germanium alloys and A(III)/B(V)-type semiconductors using the cleaning method as described above.

For example, the said device may be chosen from CMOS (Complementary Metal-Oxide Semiconductor) devices and devices such as MOSFET (Metal-Oxide Semiconductor Field-Effect Transistor).

BRIEF DESCRIPTION OF THE DRAWINGS

The invention will now be described in detail in the following description, given with reference to the appended drawings in which.

DETAILED DESCRIPTION OF THE INVENTION

Figure 1:
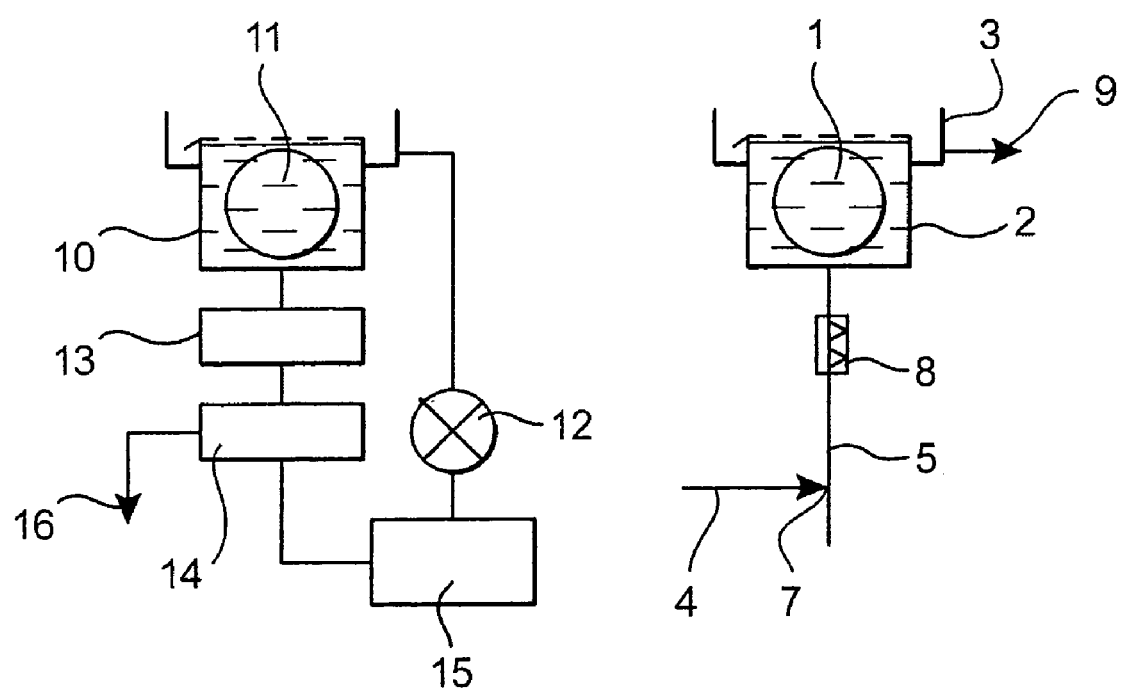
FIG. 1 is a schematic sectional view of the tanks used for implementing a DDC method and the method according to the invention.

FIG. 1 is a schematic vertical sectional view that describes the system of two tanks, which are used to carry out a DDC (Diluted Dynamic Clean)-type method. Each of the two tanks, which are generally made of quartz, contains a chemical bath. This tank system generally forms part of a robotized machine with automatic control of the baths as regards their preparation, their monitoring and their generation. This system has already been detailed above and is described in detail especially in documents [4] and [5] to which the reader may refer. This system and this machine may also be used for implementing the method of the invention, by making a few adaptations that can be easily carried out by the man skilled in the art.

The method according to the invention is a method of cleaning a surface. The term "cleaning" is understood in general according to the invention to mean the removal, from the said surface, of undesirable contaminants and pollutants on the surface. The method according to the invention makes it possible to remove any contaminant or pollutant, whatever its nature. The contaminants and pollutants that are found on the surfaces cleaned by the method according to the invention may be organic, mineral or metallic contaminants and pollutants and they may be present in particulate or other form.

Among organic pollutants, mention may be made of hydrocarbons.

Among mineral pollutants, mention may be made, for example, of salts, such as nitrates and sodium chloride.

Even particulate contamination is removed very effectively by the method of the invention.

The pollutants and contaminants are, for example, pollutants and contaminants resulting from a prior treatment step carried out on the surface, for example a chemical-mechanical polishing step.

The cleaning method according to the invention mainly comprises two cleaning steps which are, preferably, repeated once so that the cleaning method according to the invention generally comprises principally four cleaning steps resulting from the repetition of a sequence of two steps carried out in two chemical baths.

A first chemical bath (11), for deoxidation, is for example in the tank (10), which has a deionized water recirculation loop with a pump (12) illustrated in FIG. 1. This bath (11) employs a chemistry based on dilute HF, for example 1% HF, in deionized water; a second bath (1) for reoxidation is in the tank or reactor (2) having an overflow provided with a static mixer (8) illustrated in FIG. 1. This bath employs a chemistry essentially based on an acid, such as HCl, diluted in deionized water, with the optional addition of a strong oxidizing agent, such as ozone, which rinses the substrates under oxidizing conditions.

More precisely, the first step (step a)) of the method according to the invention consists of deoxidation of the surface.

The purpose of this step is to remove the chemical or native oxide on the surface by what is called an "underetching" mechanism.

The 49% hydrofluoric acid concentration (which is standard in microelectronics) used must be such that it allows complete deoxidation of the surface. For example, for effectively deoxidizing SiGe surfaces, without roughening the SiGe surface, an HF concentration of between 0.2% and 2% by volume may preferably be used.

More preferably, the HF concentration is 1% by volume.

The roughening of the surface, or the tendency to form pitting, due to the oxidation of the silicon surface in the presence of noble metals, in an HF medium, must be avoided. To do this, oxidizing or complexing agents, such as HCl, may be added. In the case of SiGe surfaces, a combination of HF and HCl gases, with an HCl concentration preferably between 0.5 and 2% by volume, more preferably with a concentration of 1% by volume, makes it possible to maintain a pH close to 1 and this promotes better removal of the metallic contamination.

In this first, etching step, the deoxidation time applied must generally be sufficient to remove the chemical or native oxide present initially on the surface. In the case of an SiGe material, the deoxidation time is for example less than 5 minutes so as to avoid roughening the surface by prolonged periods in which the substrate is in contact with HF.

In general, the duration of the contacting depends in particular on the material and on the thickness of the material that it is desired to remove.

The man skilled in the art will adapt this time according to the HF concentration. For example, the usual time applied on SiGe is around 4 minutes.

The etching rate will be determined experimentally by a person skilled in the art through successive trials.

To avoid any contamination of the bath by metals, such as Fe and Cu, and noble metals such as Ag, a purification filter or "chemical purifier" (15)—that is to say a device containing a resin that complexes the metal ions—may preferably be installed in the recirculation loop of the tank or reactor (10) in this step a) of the method according to the invention.

Advantageously, the cleanliness of the baths is achieved by using high-purity products, i.e. ULSI (Ultra Large Scale Integration) and SULSI (Super Ultra Large Scale Integration) products, namely products whose content of particles, metals, phosphates, nitrates and chlorides is of the order of a few ppb, the main constituent of which is deionized water (DIW). The device is generally supplemented with continuous recirculation through 0.1 µm filters (13).

This deoxidation step a) is also responsible for lifting off particles, due to the suppression of the oxide, which mechanism comes into play in the removal of the particulate contamination.

In this step a) of the method according to the invention, the use of a dilute chemistry employing HF baths has the advantage of reducing the consumption of chemicals and the hazardous handling of chemicals.

The second step b) of the method of the invention consists in reforming or regenerating the oxide that has been removed during step a). It takes place in deionized rinsing water from which particles have generally been filtered, and it involves surface reoxidation.

An acid pH, namely in general less than 5, must be maintained throughout the sequence in order to promote removal of the particulate contamination and to maintain electrostatic repulsion conditions. In particular in the case of SiGe surface cleaning, this may entail a small quantity of HCl acid, for example between 0.01% and 1%, being injected into the deionized water during the first few minutes of rinsing, without adding any other chemical. The acidification may be carried out by other acids, such as nitric acid, acetic acid or the like, or mixtures of acids.

The oxidation of the surface is carried out at room temperature thanks to the addition into the DIW of a powerful oxidizing agent. For example, if ozone is used as oxidizing agent for oxidizing SiGe surfaces, a sufficient concentration must be applied so as to rapidly generate a sufficient oxide thickness. The ozone concentration in the deionized water is generally 3 ppm to 15 ppm, preferably from 6 ppm to 15 ppm. To increase the effectiveness of particulate removal, acoustic activity, such as megasonic waves at a frequency for example of 1 to 1.8 MHz, may be generated for a few minutes. Generally in our case, this is applied for a minimum duration of 5 minutes, preferably a minimum duration of 10 minutes, for example 5 to 20 minutes.

As indicated above, the pH in the rinsing solution must be kept acid, namely generally at a value of less than 5.

The deoxidation/reoxidation sequence (first step a) and second step b)) is generally repeated once or twice so as to ensure optimum removal of the particulate and metallic contamination.

Thus, when these steps are repeated once, the method according to the invention will include a third step c) and a fourth step d).

The third step c) is identical to the first step a) in terms of composition of chemicals. Only the contact time with HF may be shortened. It is generally between 30 seconds and 2 minutes in the case of SiGe surfaces. By removing the oxide that has just been formed by the preceding oxidation step, the underetching mechanism needed for removing the particles is amplified.

The fourth step d) is identical to the second step b) in terms of time and quantity of chemicals injected. Its sole purpose is to regenerate the oxide removed during the third step, allowing final passivation of the surface.

Finally, after steps a) and b), or after step c) and d) if steps a) and b) are repeated, a final drying operation is carried out, for example using isopropanol (isopropyl alcohol), or by centrifugation.

It should be noted that, before steps a) and b), which are optionally repeated, a chemical solution may be added upstream of the cleaning sequence. The purpose of this step $a_0$) is to reduce the initial organic contamination before the essential deoxidation and reoxidation steps. It provides more a coarse decontamination or precleaning rather than meeting a requirement of use. This solution may be an aqueous solution containing ozone, with a concentration of 6 ppm or less ($6 \times 10^{-3}$ g/l), or a CARO solution based on $H_2SO_4$ and $H_2O_2$ (with a concentration of 0.5 vol % or less).

Figure 2:
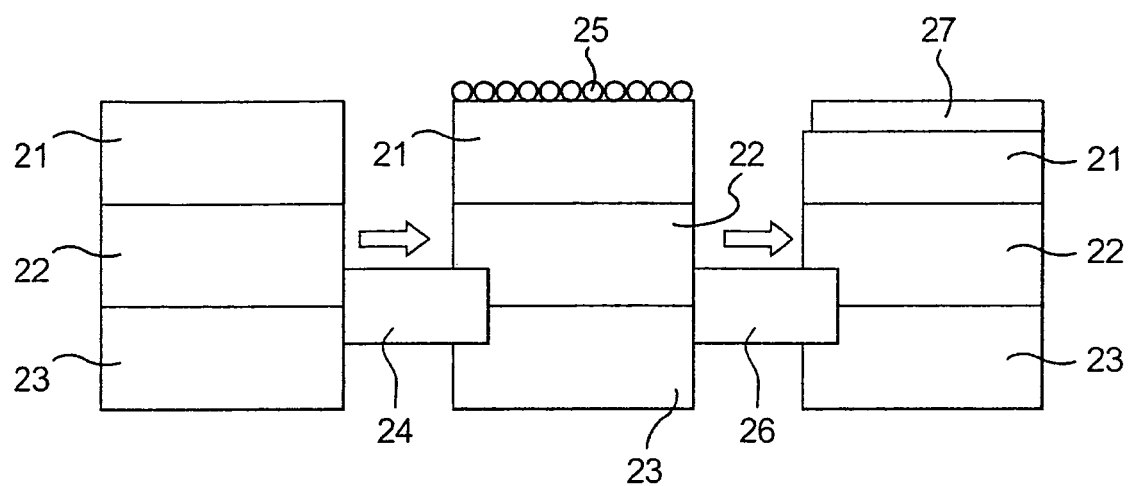
FIG. 2 is a diagram showing the principle of how the cleaning method according to the invention is integrated into a method for producing microelectronic structures.

FIG. 2 illustrates the manner whereby the cleaning method according to the invention is integrated into a method for producing microelectronic structures.

A layer of SiGe (21) of constant composition, for example containing 20 to 50% Si, which is on a graded SiGe layer (having a Ge gradient) (22), itself on a (001) Si substrate (23), is subjected to a conventional chemical-mechanical polishing operation (24). This polishing operation leaves the surface of the SiGe layer (21) with impurities (25) that comprise organic, mineral, metallic and particulate contaminants, these contaminants (25) all being removed by cleaning (26) using the method of the invention, after which a strained Si layer (27) is formed on the SiGe layer (21).

The method can then be continued via conventional steps that result in the formation of structures such as strained Si-CMOS, strained Si-MOSFET and strained SOI-MOSFET structures.

The invention will now be described with reference to the following examples, given by way of illustration but implying no limitation.

EXAMPLE 1

In this example, the cleaning was carried out using the method according to the invention on a base substrate possessing the following structure:
<100> $Si_{0.5}Ge_{0.5}$ relaxed substrate having a total thickness of greater than 2 μm, with a graded layer of thickness greater than 1 μm and a layer of constant composition with a thickness close to 1 μm;
the said relaxed substrate was grown epitaxially on a lightly p-doped (7 to 10 Ω·m)<100> Si substrate.

The cleaning according to the invention comprised the following successive steps:
"decontaminating" cleaning with an $H_2SO_4$ solution to which 100 cm³ of $H_2O_2$ had been added—this is step $a_0$) of the method according to the invention;
automated cleaning, broken down into two successive main steps:
step 1: contacting of the substrate with an HF solution containing 0.20% HF and 1% HCl in deionized water, for a time of 4 minutes, at ordinary ambient temperature (close to 20° C.). This is step a) of the method according to the invention, which allows the chemical native oxide present on the surface of the substrate to be removed;
step 2: contacting of the substrate with a solution containing 0.01% HCl in deionized water for a period of 3 minutes followed by injection of gaseous $O_3$, and continuation of the contacting with the acidified solution containing 6 ppm $O_3$ for a time of 7 minutes, in the presence of 1.8 MHz megasonic waves. This is step b) of the method of the invention, which allows a protective chemical oxide with a thickness close to about 20 Å to be reformed.

Steps 1 and 2 were repeated once, using the same operating conditions, apart from the duration of the second deoxidation (repetition of step 1), which was now only 1 minute 30 seconds instead of 4 minutes.

Repeating these steps ensures optimum removal of the particulate contamination resulting from the chemical-mechanical polishing residues, i.e. close to 85% removal, which is only limited by the presence of many epitaxial defects at the wafer edge.

After cleaning by the method of the invention, a final cleaning operation was generally carried out using a 0.2% HF solution, called "HF last" (this cleaning does not in general fall within the context of the method of the invention—it is a complementary method), and then an annealing operation was carried out in a hydrogen atmosphere at 800° C., for 2 minutes, at a pressure of 20 torr, followed by re-epitaxy in an RP-CVD (reduced-pressure chemical vapour deposition) chamber, which made it possible, at 750° C., to regrow silicon with a thickness of 50 nm using DCS (dichlorosilane ($SiH_2Cl_2$)+silane ($SiH_4$) chemistry.

EXAMPLE 2

In this example, the cleaning was carried out by the method of the invention on a base substrate possessing the following structure:
transferred <100> $Si_{0.8}Ge_{0.2}$ on insulator substrate (SGOI, i.e. SiGe on insulator structure).

The cleaning according to the invention comprised the following successive steps:
decontaminating cleaning using a pure $H_2SO_4$ solution (96 vol % $H_2SO_4$, standard in microelectronics), to which 100 cm³ of $H_2O_2$ had been added. This is step $a_0$) of the method according to the invention;
automated cleaning, broken down into two successive main steps:
step 1: contacting of the substrate with an HF solution containing 0.20% HF and 1% HCl in deionized water, for a time of 4 minutes, at ordinary ambient temperature (close to 20° C.). This is step a) of the method according to the invention, which allows the chemical or native oxide present on the surface of the substrate to be removed;
step 2: contacting of the substrate with a solution containing 0.01% HCl in deionized water for a period of 3 minutes followed by injection of gaseous $O_3$, and continuation of the contacting with the acidified solution containing 6 ppm $O_3$ for a time of 7 minutes, in the presence of 1.8 MHz megasonic waves. This is step b) of the method of the invention, which allows a protective chemical oxide with a thickness close to about 20 Å to be reformed.

Steps 1 and 2 are repeated once.

After cleaning by the method of the invention, a final HF cleaning operation, called "HF last", was carried out, and then an annealing operation was carried out in a hydrogen atmosphere at 800° C., for 2 minutes, at a pressure of 20 torr, followed by re-epitaxy in an RP-CVD chamber, which made it possible, at 750° C., to regrow 10 nm of $Si_{0.8}Ge_{0.2}$, 10 nm of Si and 30 nm of $Si_{0.8}Ge_{0.2}$ (using DCS chemistry).

EXAMPLE 3 (COMPARATIVE EXAMPLE)

An $Si_{0.5}Ge_{0.5}$ surface was cleaned by an RCA-type method under dilute conditions, at a temperature below 40° C.

The surface was firstly treated with an $NH_4OH/H_2O_2/H_2O$ solution (with volume ratios of 0.012/1/20) and then with an $HCl/H_2O_2/H_2O$ solution (with volume ratios of 1/1/80).

Figure 3:
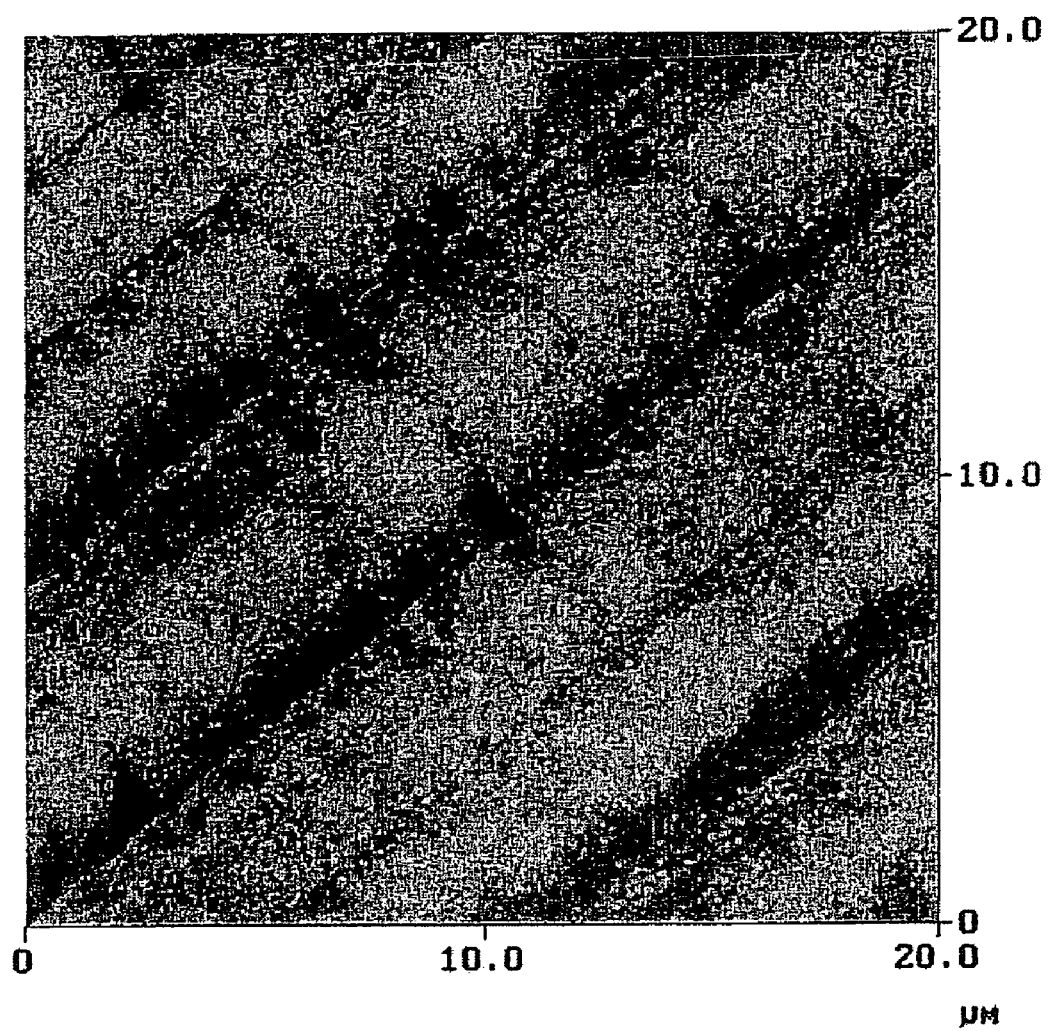
FIG. 3 is a micrograph of an $Si_{0.5}Ge_{0.5}$ surface observed by AFM (Atomic Force Microscopy) after cleaning of the dilute RCA type (Example 3)

The surface obtained after the cleaning was observed by AFM (Atomic Force Microscopy). FIG. 3 is a micrograph of a square having an area of 20 μm by 20 μm taken during this observation. The treated surface had an $R_{rms}$ of 0.8 nm and an $R_{max}$ of 8.05 nm.

Figure 4:
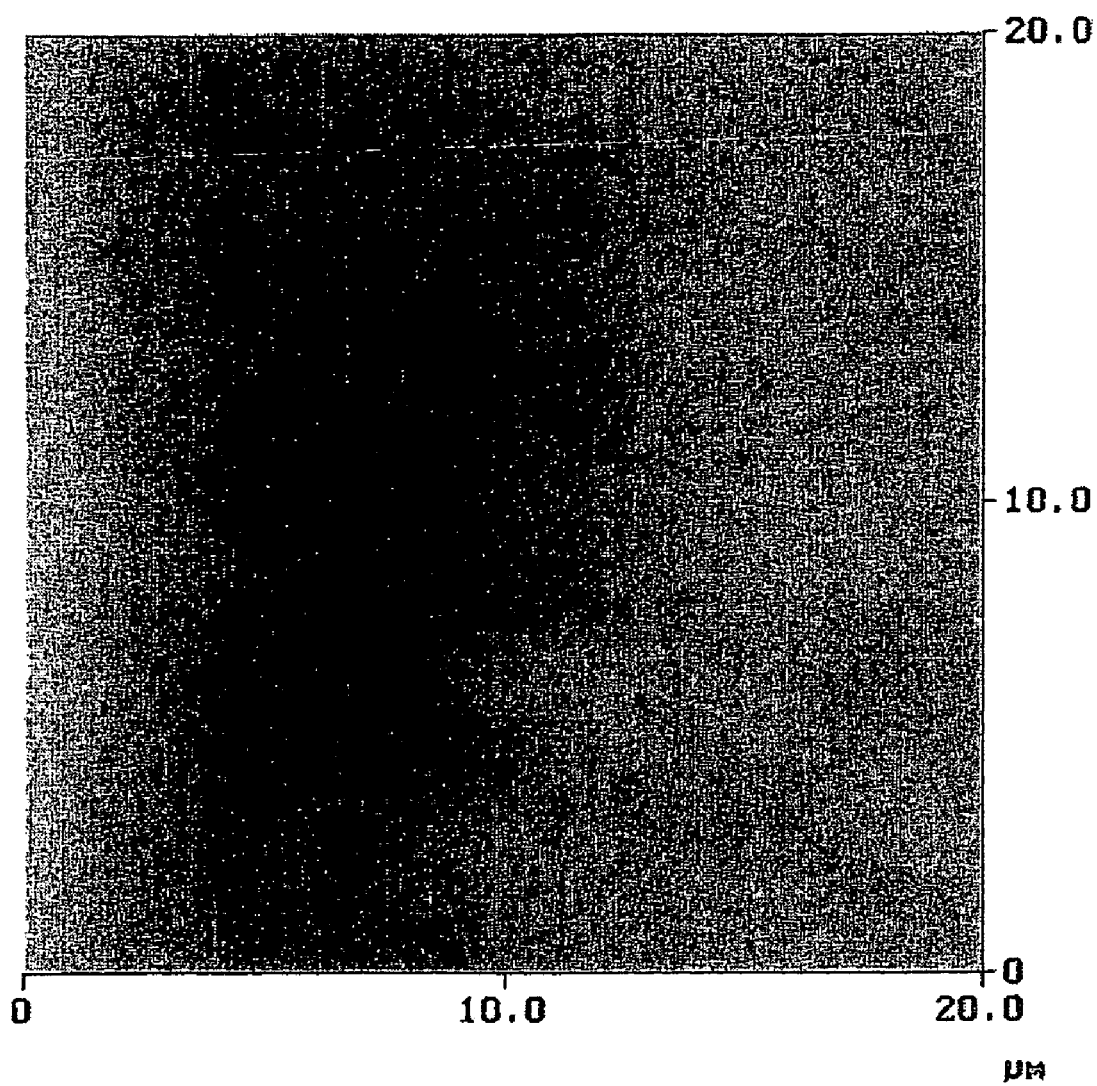
FIG. 4 is a micrograph of an $Si_{0.5}Ge_{0.5}$ surface observed by AFM after cleaning by the method according to the invention.

This FIG. 3 is to be compared with FIG. 4, which is a micrograph of a square of area 20 μm by 20 μm taken during observation of a surface by AFM after a cleaning treatment using the DDC method of the invention.

The treated surface has an $R_{rms}$ of 0.44 nm and an $R_{max}$ of 2.83 nm, these being very much lower than the values in FIG. 3 (prior art).

Simple visual comparison of the micrographs in FIGS. 3 and 4 clearly shows that a surface of much greater quality is obtained after cleaning using the method of the invention.

REFERENCES

[1] J. M. Hartmann, B. Gallas, J. Zhang and J. J. Harris, Semicond. Sci. Technol. 15 (2000), 370.
[2] K. Sawano, K. Kawaguchi, T. Ueno, S. Koh, K. Nakagawa and Y. Shiroki, Mat. Sci. Eng. B89 (2002), 406.
[3] K. Sawano, K. Kawaguchi, S. Koh, Y. Hirose, T. Hattori, K. Nakagawa and Y. Shiraki, J. Electrochem. Soc. 150 (2003), G376.
[4] F. Tardif, T. Lardin, P. Boelen, R. Novak and I. Kashkouch, Proceedings of the 3rd International Symposium, UCPSS 1996, 175.
[5] F. Tardif, T. Lardin, A. Danel, P. Boelen, C. Cowache, I. Kashkoush and R. Novak, Proceedings of the 4th International Symposium, UCPSSS 1998, 19.

The invention claimed is:

1. A method of wet cleaning a surface in which the following successive steps are carried out:
  $a_o$) the surface is brought into contact with an $H_2SO_4$ solution to which 0.5 vol % or less of $H_2O_2$ has been added, for a time of about 5 minutes;
  a) the surface is brought into contact with an HF/HCL solution, having respective concentrations of 0.2 vol % and 1 vol %, in deionized water, for a time of about 4 minutes;
  b) the surface is rinsed with a 0.01 wt % HCL solution in deionized water for a time of about 3 minutes;
  c) the surface is rinsed with a 0.01 vol % HCL solution in deionized water, into which 6 ppm of $O_3$ has been injected, in the presence of megasonic waves;
  d) step a) is repeated, the contacting time being about 1 minute 30 seconds;
  e) step b) is repeated;
  f) step c) is repeated; and
  g) the surface is dried, wherein the surface is made of a silicon-germanium alloy of formula $Si_{1-x}Ge_x$ where x is greater than 0 and less than 1, x preferably lying within the range of 0.1 to 0.9, more preferably from 0.1 to 0.7 and better still from 0.2 to 0.5.

2. The method according to claim 1, wherein the surface is a surface of an electronic, optical or optoelectronic device.

3. The method according to claim 2, wherein the device is selected from CMOS (Complementary Metal-Oxide Semiconductor) devices and MOSFET (Metal-Oxide Semiconductor Field-Effect Transistor) devices.

* * * * *